United States Patent [19]
Sandhu et al.

[11] Patent Number: 6,081,034
[45] Date of Patent: Jun. 27, 2000

[54] LOW-RESISTANCE CONTACT TO SILICON HAVING A TITANIUM SILICIDE INTERFACE AND AN AMORPHOUS TITANIUM CARBONITRIDE BARRIER LAYER

[75] Inventors: Gurtej S. Sandhu; Trung T. Doan; Tyler A. Lowrey, all of Boise, Id.

[73] Assignee: Micron Technology, Inc., Boise, Id.

[21] Appl. No.: 09/012,685

[22] Filed: Jan. 23, 1998

Related U.S. Application Data

[63] Continuation of application No. 08/509,708, Jul. 31, 1995, Pat. No. 5,723,382, which is a continuation-in-part of application No. 08/228,795, Apr. 15, 1994, abandoned, which is a continuation of application No. 07/898,059, Jun. 12, 1992, abandoned.

[51] Int. Cl.$^7$ .................................................. H01L 23/48
[52] U.S. Cl. ........................ 257/764; 257/740; 257/750; 257/741
[58] Field of Search ................................ 257/764, 740, 257/741, 750, 763

[56] References Cited

U.S. PATENT DOCUMENTS

| | | |
|---|---|---|
| 3,637,320 | 1/1972 | Wakefield et al. . |
| 3,807,008 | 4/1974 | Reedy, Jr. . |
| 4,035,541 | 7/1977 | Smith et al. . |
| 4,497,874 | 2/1985 | Hale . |
| 4,830,886 | 5/1989 | Co et al. . |
| 4,960,732 | 10/1990 | Dixit et al. . |
| 4,990,997 | 2/1991 | Nishida . |
| 5,001,531 | 3/1991 | Yamaguchi et al. ..................... 257/414 |
| 5,049,975 | 9/1991 | Ajika et al. .............................. 257/764 |
| 5,087,593 | 2/1992 | Narula . |
| 5,132,756 | 7/1992 | Matsuda .................................. 257/653 |
| 5,139,825 | 8/1992 | Gordon et al. . |
| 5,178,911 | 1/1993 | Gordon et al. . |
| 5,192,589 | 3/1993 | Sandhu . |
| 5,246,881 | 9/1993 | Sandhu et al. . |
| 5,384,289 | 1/1995 | Westmoreland . |
| 5,496,762 | 3/1996 | Sandhu et al. . |
| 5,536,947 | 7/1996 | Klersy et al. ............................ 257/3 |
| 5,571,572 | 11/1996 | Sandhu . |
| 5,723,382 | 3/1998 | Sandhu et al. . |
| 5,893,758 | 4/1999 | Sandhu et al. .......................... 438/708 |

FOREIGN PATENT DOCUMENTS

| | | | |
|---|---|---|---|
| 404038875 | 2/1992 | Japan | ..................... 257/764 |
| 4-87328 | 6/1992 | Japan . | |

OTHER PUBLICATIONS

Wakefield, G.F., et al., "Preparation of Titanium Carbonitride From Mono–, Di–, and Tri–Methyl Amines;" 4th International Conference on CVD, Electrochemical Society, 1973, pp. 173–150.

Politis, C., et al., "Preparation, Characterization and Superconducting Properties of TiN and TiCxNy Single Crystals Prepared By CVD;" 7th International Conference on CVD, Electrochemical Society, 1979, pp. 289–299.

Raaijmakers, Ivo J., et al., "Contact Hole Fill with Low Temperature LPCVD TiN", YMIC Conference Jun. 12–Jun. 13, 1990, pp. 219–225.

*Primary Examiner*—Tom Thomas
*Assistant Examiner*—Ori Nadav
*Attorney, Agent, or Firm*—Trask, Britt & Rossa

[57] ABSTRACT

This invention constitutes a contact structure incorporating an amorphous titanium nitride barrier layer formed via low-pressure chemical vapor deposition (LPCVD) utilizing tetrakis-dialkylamido-titanium, Ti(NMe$_2$)$_4$, as the precursor. The contact structure is fabricated by etching a contact opening through an dielectric layer down to a diffusion region to which electrical contact is to be made. Titanium metal is deposited over the surface of the wafer so that the exposed surface of the diffusion region is completely covered by a layer of the metal. At least a portion of the titanium metal layer is eventually converted to titanium silicide, thus providing an excellent conductive interface at the surface of the diffusion region. A titanium nitride barrier layer is then deposited using the LPCVD process, coating the walls and floor of the contact opening. Chemical vapor deposition of polycrystalline silicon, or of metal, such as tungsten, follows, and proceeds until the contact opening is completely filled with either polycrystalline silicon or metal.

3 Claims, 4 Drawing Sheets

LOW-RESISTANCE CONTACT TO SILICON HAVING A TITANIUM SILICIDE INTERFACE AND AN AMORPHOUS TITANIUM CARBONITRIDE BARRIER LAYER

This application is a continuation of U.S. application Ser. No. 08/509,708, filed Jul. 31, 1995 now U.S. Pat. No. 5,723,382, which is a continuation-in-part of U.S. application Ser. No. 08/228,795, filed Apr. 15, 1994, now abandoned, which is a continuation of now abandoned U.S. application Ser. No. 07/898,059, filed Jun. 12, 1992.

FIELD OF THE INVENTION

This invention relates to integrated circuit manufacturing technology and, more specifically, to structures for making low resistance contact through a dielectric layer to a diffusion region in an underlying silicon layer. The structures include an amorphous titanium nitride barrier layer that is deposited via chemical vapor deposition.

BACKGROUND OF THE INVENTION

The compound titanium nitride (TiN) has numerous potential applications because it is extremely hard, chemically inert (although it readily dissolves in hydrofluoric acid), an excellent conductor, possesses optical characteristics similar to those of gold, and has a melting point around 3000° C. This durable material has long been used to gild inexpensive jewelry and other art objects. However, during the last ten to twelve years, important uses have been found for TiN in the field of integrated circuit manufacturing. Not only is TiN unaffected by integrated circuit processing temperatures and most reagents, it also functions as an excellent barrier against diffusion of dopants between semiconductor layers. In addition, TiN also makes excellent ohmic contact with other conductive layers.

In a common application for integrated circuit manufacture, a contact opening is etched through an insulative layer down to a diffusion region to which electrical contact is to be made. Titanium metal is then sputtered over the wafer so that the exposed surface of the diffusion region is coated. The titanium metal is eventually converted to titanium silicide, thus providing an excellent conductive interface at the surface of the diffusion region. A titanium nitride barrier layer is then deposited, coating the wails and floor of the contact opening. Chemical vapor deposition of tungsten or polysilicon follows. In the case of tungsten, the titanium nitride layer provides greatly improved adhesion between the walls of the opening and the tungsten metal. In the case of the polysilicon, the titanium nitride layer acts as a barrier against dopant diffusion from the polysilicon layer into the diffusion region.

Titanium nitride films may be created using a variety of processes. Some of those processes are reactive sputtering of a titanium nitride target; annealing of an already deposited titanium layer in a nitrogen ambient; chemical vapor deposition at high temperature and at atmospheric pressure, using titanium tetrachloride, nitrogen and hydrogen as reactants; and chemical vapor deposition at low-temperature and at atmospheric pressure, using ammonia and $Ti(NR_2)_4$ compounds as precursors. Each of these processes has its associated problems.

Both reactive sputtering and nitrogen ambient annealing of deposited titanium result in films having poor step coverage, which are not useable in submicron processes. Chemical vapor deposition processes have an important advantage in that conformal layers of any thickness may be deposited. This is especially advantageous in ultra-large-scale-integration circuits, where minimum feature widths may be smaller than 0.5 μm. Layers as thin as 10 Å may be readily produced using CVD. However, TiN coatings prepared using the high-temperature APCVD process must be prepared at temperatures between 900–1000° C. The high temperatures involved in this process are incompatible with conventional integrated circuit manufacturing processes. Hence, depositions using the APCVD process are restricted to refractory substrates such as tungsten carbide. The low temperature APCVD, on the other hand, though performed within a temperature range of 100–400° C. that is compatible with conventional integrated circuit manufacturing processes, is problematic because the precursor compounds (ammonia and $Ti(NR_2)_4$) react spontaneously in the gas phase. Consequently, special precursor delivery systems are required to keep the gases separated during delivery to the reaction chamber. In spite of special delivery systems, the highly spontaneous reaction makes full wafer coverage difficult to achieve. Even when achieved, the deposited films tend to lack uniform conformality, are generally characterized by poor step coverage, and tend to deposit on every surface within the reaction chamber, leading to particle problems.

U.S. Pat. No. 3,807,008, which issued in 1974, suggested that tetrakis dimethylamino titanium, tetrakis diethylamino titanium, or tetrakis diphenylamino titanium might be decomposed within a temperature range of 400–1,200° C. to form a coating on titanium-containing substrates. It appears that no experiments were performed to demonstrate the efficacy of the suggestion, nor were any process parameters specifically given. However, it appears that the suggested reaction was to be performed at atmospheric pressure.

In U.S. Pat. No. 5,178,911, issued to R. G. Gordon, et al., a chemical vapor deposition process is disclosed for creating thin, crystalline titanium nitride films using tetrakis-dimethylamido-titanium and ammonia as precursors.

In the J. Appl. Phys. 70(7) October 1991, pp 3,666–3,677, A. Katz and colleagues describe a rapid-thermal, low-pressure, chemical vapor deposition (RTLPCVD) process for depositing titanium nitride films, which, like those deposited by the process of Gordon, et al., are crystalline in structure.

SUMMARY OF THE INVENTION

This invention constitutes a contact structure incorporating an amorphous titanium nitride barrier layer formed via low-pressure chemical vapor deposition (LPCVD) utilizing tetrakis-dialkylamido-titanium, $Ti(NMe_2)_4$, as the precursor. Although the barrier layer compound is primarily amorphous titanium nitride, its stoichiometry is variable, and it may contain carbon impurities in amounts which are dependant on deposition and post-deposition conditions. The barrier layers so deposited demonstrate excellent step coverage, a high degree of conformality, and an acceptable level of resistivity. Because of their amorphous structure (i.e., having no definite crystalline structure), the titanium nitride layer acts as an exceptional barrier to the migration of ions or atoms from a metal layer on one side of the titanium carbonitride barrier layer to a semiconductor layer on the other side thereof, or as a barrier to the migration of dopants between two different semiconductor layers which are physically separated by the barrier layer.

The contact structure is fabricated by etching a contact opening through a dielectric layer down to a diffusion region to which electrical contact is to be made. Titanium metal is deposited over the surface of the wafer so that the exposed surface of the diffusion region is completely covered by a layer of the metal. Sputtering is the most commonly utilized method of titanium deposition. At least a portion of the titanium metal layer is eventually converted to titanium silicide, thus providing an excellent conductive interface at the surface of the diffusion region. A titanium nitride barrier layer is then deposited using a low-pressure chemical vapor deposition (LPCVD) process, coating the walls and floor of the contact opening. Chemical vapor deposition (CVD) of polycrystalline silicon, or of a metal, such as tungsten, follows, and proceeds until the contact opening is completely filled with either polycrystalline silicon or the metal. In the case of the polysilicon, which must be doped with N-type or P-type impurities to render it conductive, the titanium nitride layer acts as a barrier against dopant diffusion from the polysilicon layer into the diffusion region. In the case of CVD tungsten, the titanium nitride layer protects the junction from reactions with precursor gases during the CVD deposition process, provides greatly improved adhesion between the walls of the opening and the tungsten metal, and prevents the diffusion of tungsten atoms into the diffusion region.

Deposition of the titanium nitride barrier layer takes place in a low-pressure chamber (i.e, a chamber in which pressure has been reduced to less than 100 torr prior to deposition), and utilizes a metal-organic tetrakis-dialkylamido-titanium compound as the sole precursor. Any noble gas, as well as nitrogen or hydrogen, or a mixture of two or more of the foregoing may be used as a carrier for the precursor. The wafer is heated to a temperature within a range of 200–600° C. Precursor molecules which contact the heated wafer are pyrolyzed to form titanium nitride containing variable amounts of carbon impurities, which deposits as a highly conformal film on the wafer.

The carbon content of the barrier film may be minimized by utilizing tetrakis-dimethylamido-titanium, $Ti(NMe_2)_4$, as the precursor, rather than compounds such as tetrakis-diethylamido-titanium or tetrakis-dibutylamido-titanium, which contain a higher percentage of carbon by weight. The carbon content of the barrier film may be further minimized by performing a rapid thermal anneal step in the presence of ammonia.

The basic deposition process may be enhanced to further reduce the carbon content of the deposited titanium nitride film by introducing one or more halogen gases, or one or more activated species (which may include halogen, $NH_3$, or hydrogen radicals) into the deposition chamber. Halogen gases and activated species attack the alkyl-nitrogen bonds of the primary precursor and convert displaced alkyl groups into volatile compounds.

As heretofore stated, the titanium carbonitride films formed by the instant chemical vapor deposition process are principally amorphous compounds. Other processes currently in use for depositing titanium nitride-containing compounds as barrier layers within integrated circuits result in titanium nitride having crystalline structures. As atomic and ionic migration tends to occur at crystal grain boundaries, an amorphous film is a superior barrier to such migration.

PREFERRED EMBODIMENT OF THE INVENTION

The integrated circuit contact structure that is the focus of this disclosure is unique because of the use of a predominantly amorphous titanium or titanium carbonitride barrier layer therein. The layer is deposited using a lowpressure chemical vapor deposition (LPCVD) process that is the subject of previously filed U.S. patent applications as heretofore noted.

Figure 1:
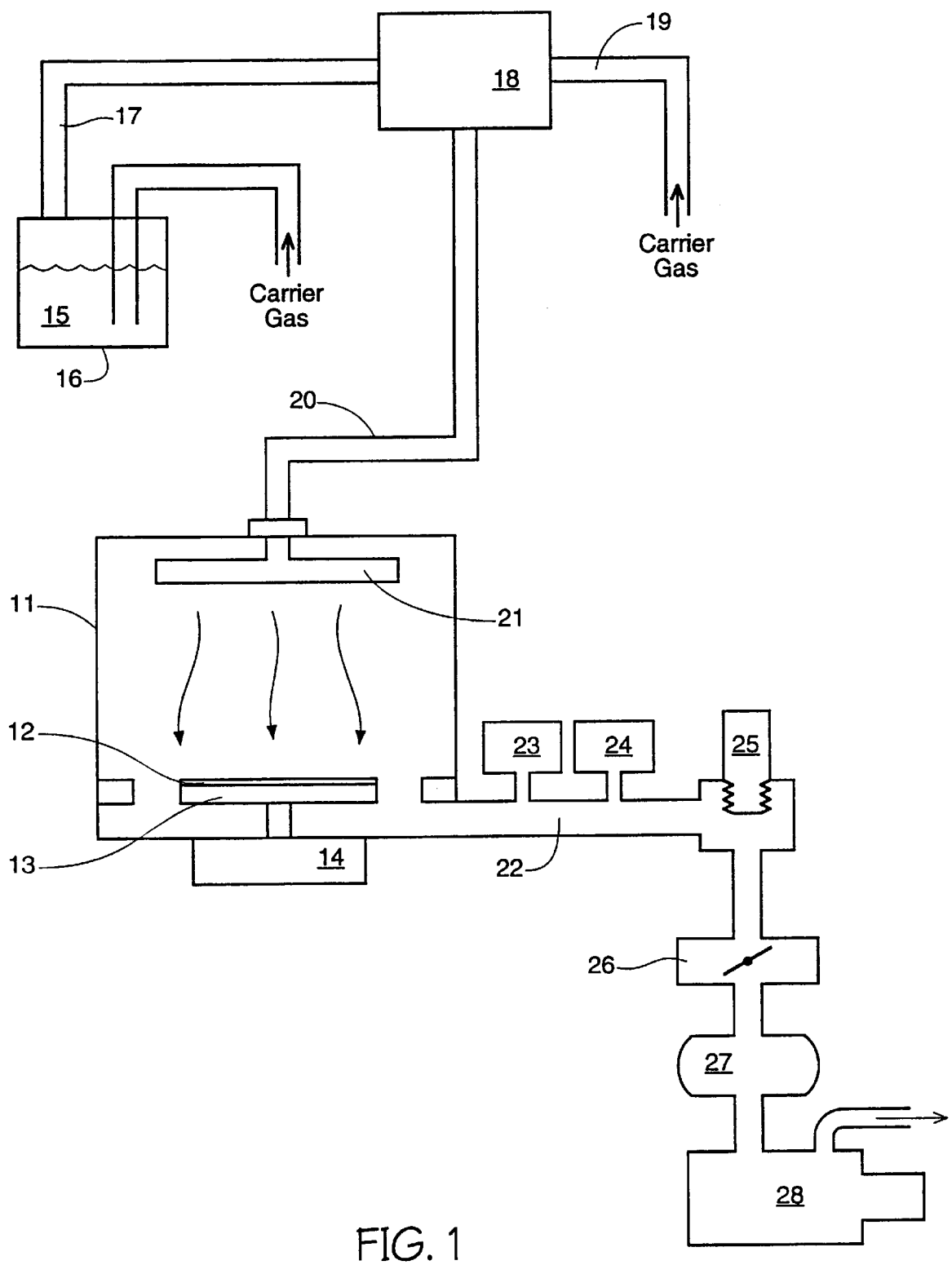
FIG. 1 is a block schematic diagram of a low-pressure chemical vapor deposition reactor system.

The LPCVD process for depositing highly conformal titanium nitride and titanium carbonitride barrier films will now be briefly described in reference to the low-pressure chemical vapor deposition reactor system depicted in FIG. 1. The deposition process takes place in a cold wall chamber 11. A wafer 12, on which the deposition will be performed, is mounted on a susceptor plate 13, which is heated to a temperature within a range of 200–600° C. by a heat lamp array 14. For the instant process, a carrier gas selected from a group consisting of the noble gases and nitrogen and hydrogen is bubbled through liquid tetrakis-dialkylamido-titanium 15 (the sole metal-organic precursor compound) in a bubbler apparatus 16.

It should be noted that tetrakis-dialkylamido-titanium is a family of compounds, of which tetrakis-dimethylamido-titanium, tetrakis-diethylamido-titanium and tetrakis-dibutylamido-titanium have been synthesized. Because of its lower carbon content per unit of molecular weight, tetrakis (dimethylamido-titanium is the preferred precursor because it results in barrier films having lower carbon content. However, any of the three compounds or any combination of the three compounds will result in highly conformal barrier layers when pyrolyzed (decomposition by heating) in a CVD deposition chamber. These barrier layers are characterized by an amorphous structure, and by step coverage on vertical wall portions near the base of submicron contact openings having depth-to-width aspect ratios of 3:1 that range from 80–90 percent of the horizontal film thickness at the top of the opening.

Still referring to FIG. 1, the carrier gas, at least partially saturated with a vaporized precursor compound, is transported via a primary intake manifold 17 to a premix chamber 18. Additional carrier gas may be optionally supplied to premix chamber 18 via supply tube 19. Carrier gas, mixed with the precursor compound, is then ducted through a secondary intake manifold 20 to a shower head 21, from which they enter the chamber 11. The precursor compound, upon coming into contact with the heated wafer, pyrolyzes and deposits as a highly conformal titanium carbonitride film on the surface of the wafer 12. The reaction products from the pyrolysis of the precursor compound are withdrawn from the chamber 11 via an exhaust manifold 22. Incorporated in the exhaust manifold 22 are a pressure sensor 23, a pressure switch 24, a vacuum valve 25, a pressure control valve 26, a blower 27, and a particulate filter 28, which filters out solid reactants before the exhaust is vented to the atmosphere. During the deposition process, the pressure within chamber 11 is maintained at a pressure of less than 100 torr and at a pressure of less than 1 torr by pressure control components 23, 24, 25, 26, and 27. The process parameters that are presently deemed to be optimum, or nearly so, are a carrier gas flow through secondary intake manifold 20 of 400 standard cubic centimeters per minute (scc/m), a deposition chamber temperature of 425° C., and a flow of carrier gas through bubbler apparatus 16 of 100 scc/m, with the liquid precursor material 15 being maintained at a constant temperature of approximately 40° C.

Figure 2:
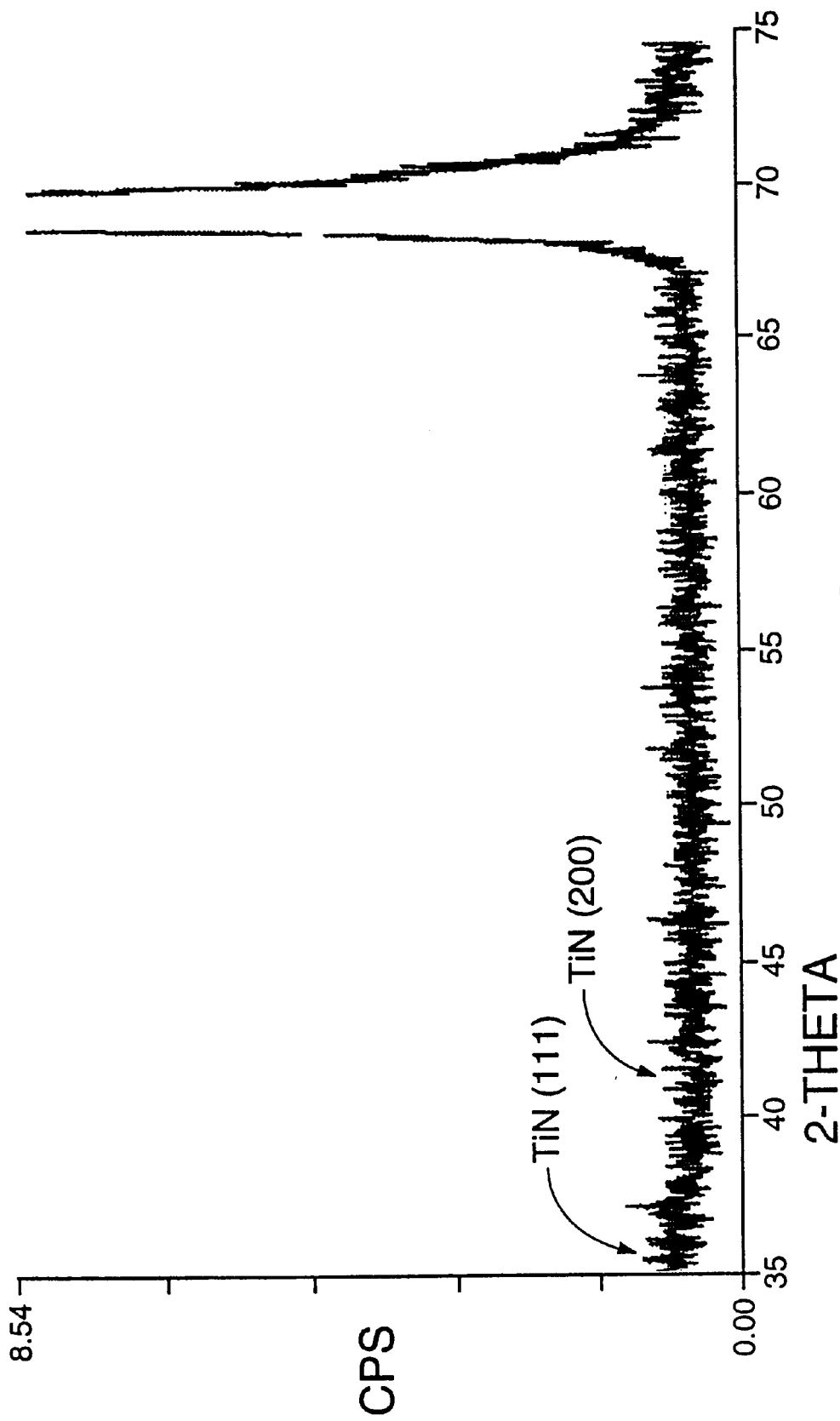
FIG. 2 is an X-ray spectrum (i.e., a plot of counts per second as a function of 2-theta)

Thus, the carrier gas (or gases) and the vaporized precursor compound are then gradually admitted into the chamber until the desired pressure and gas composition is achieved. The reaction, therefore, takes place at a constant temperature, but with varying gas partial pressures during the initial phase of the process. This combination of process parameters is apparently responsible for the deposition of titanium carbonitride having a predominantly amorphous structure as the precursor compound undergoes thermal decomposition. The X-ray spectrum of FIG. 2 is indicative of such an amorphous structure. Both the peak at a 2-theta value of 36, which is characteristic of titanium nitride having a (111) crystal orientation, and the peak at a 2-theta value of 41, which is characteristic of titanium nitride having a (200) crystal orientation, are conspicuously absent from the spectrum. Such a spectrum indicates that there is virtually no crystalline titanium nitride in the analyzed film. Incidentally, the peak at a 2-theta value of 69 is representative of silicon.

Although the compound deposited on the wafer with this process may be referred to as titanium carbonitride (represented by the chemical formula $TiC_xN_y$), the stoichiometry of the compound is variable, depending on the conditions under which it is deposited. The primary constituents of films deposited using the new process and tetrakis-dimethylamido-titanium as the precursor are titanium and nitrogen, with the ratio of nitrogen atoms to carbon atoms in the film falling within a range of 5:1 to 10:1. In addition, upon exposure to the atmosphere, the deposited films absorb oxygen. Thus the final film may be represented by the chemical formula $TiC_xN_yO_z$. The carbon and oxygen impurities affect the characteristics of the film in at least two ways. Firstly, the barrier function of the film is enhanced. Secondly, the carbon and oxygen impurities dramatically raise the resistivity of the film. Sputtered titanium nitride has a bulk sheet resistivity of approximately 75 $\mu$ohm-cm, while the titanium carbonitride films deposited through the CVD process disclosed herein have bulk sheet resistivities of 2,000 to 50,000 $\mu$ohm-cm. In spite of this dramatic increase in bulk resistivity, the utility of such films as barrier layers is largely unaffected, due to the characteristic thinness of barrier layers used in integrated circuit manufacture. A simple analysis of the contact geometry for calculating various contributions to the overall resistance suggests that metal (e.g., tungsten) plug resistance and metal-to-silicon interface resistance play a much more significant role in overall contact resistance than does the barrier layer.

There are a number of ways by which the basic LPCVD process may be enhanced to minimize the carbon content of the deposited barrier film.

The simplest way is to perform a rapid thermal anneal step in the presence of ammonia. During such a step, much of the carbon in the deposited film is displaced by nitrogen atoms.

The basic deposition process may be enhanced to further reduce the carbon content of the deposited titanium nitride film by introducing an activated species into the deposition chamber. The activated species attacks the alkyl-nitrogen bonds of the primary precursor, and converts displaced alkyl groups into volatile compounds. The activated species, which may include halogen, $NH_3$, or hydrogen radicals, or a combination thereof, are generated in the absence of the primary precursor at a location remote from the deposition chamber. Remote generation of the activated species is required because it is not desirable to employ a plasma CVD process, as $Ti(NR_2)_4$ is known to break down in plasma, resulting in large amounts of carbon in the deposited film. A high carbon content will elevate the bulk resistivity of the film to levels that are unacceptable for most integrated circuit applications. The primary precursor molecules and the activated species are mixed, preferably, just prior to being ducted into the deposition chamber. It is hypothesized that as soon as the mixing has occurred, the activated species begin to tear away the alkyl groups from the primary precursor molecules. Relatively uncontaminated titanium nitride deposits on the heated wafer surface.

Alternatively, the basic deposition process may be enhanced to lower the carbon content of the deposited titanium nitride films by introducing a halogen gas, such as $F_2$, $Cl_2$ or $Br_2$ into the deposition chamber. The halogen gas molecule attacks the alkyl-nitrogen bonds of the primary precursor compound molecule and converts the displaced alkyl groups into a volatile compound. The halogen gas is admitted to the deposition chamber in one of three ways. The first way is to admit halogen gas into the deposition chamber before the primary precursor compound is admitted. During this "pre-conditioning" step, the halogen gas becomes adsorbed on the chamber and wafer surfaces. The LPCVD deposition process is then performed without admitting additional halogen gas into the deposition chamber. As a first alternative, the halogen gas and vaporized primary precursor compound are admitted into the deposition chamber simultaneously. Ideally, the halogen gas and vaporized primary precursor compound are introduced into the chamber via a single shower head having separate ducts for both the halogen gas and the vaporized primary precursor compound. Maintaining the halogen gas separate from the primary precursor compound until it has entered the deposition chamber prevents the deposition of titanium nitride on the shower head. It is hypothesized that as soon as the mixing has occurred, the halogen molecules attack the primary precursor molecules and begin to tear away the alkyl groups therefrom. Relatively uncontaminated titanium nitride deposits on the heated wafer surface. As a second alternative, halogen gas is admitted into the chamber both before and during the introduction of the primary precursor compound.

As heretofore stated, the titanium nitride or titanium carbonitride films deposited by the described LPCVD process are predominantly amorphous compounds. Other processes currently in use for depositing titanium nitride-containing compounds as barrier layers within integrated circuits result in titanium nitride having crystalline structures. As atomic and ionic migration tends to occur at crystal grain boundaries, an amorphous film is a superior barrier to such migration.

Figure 3:
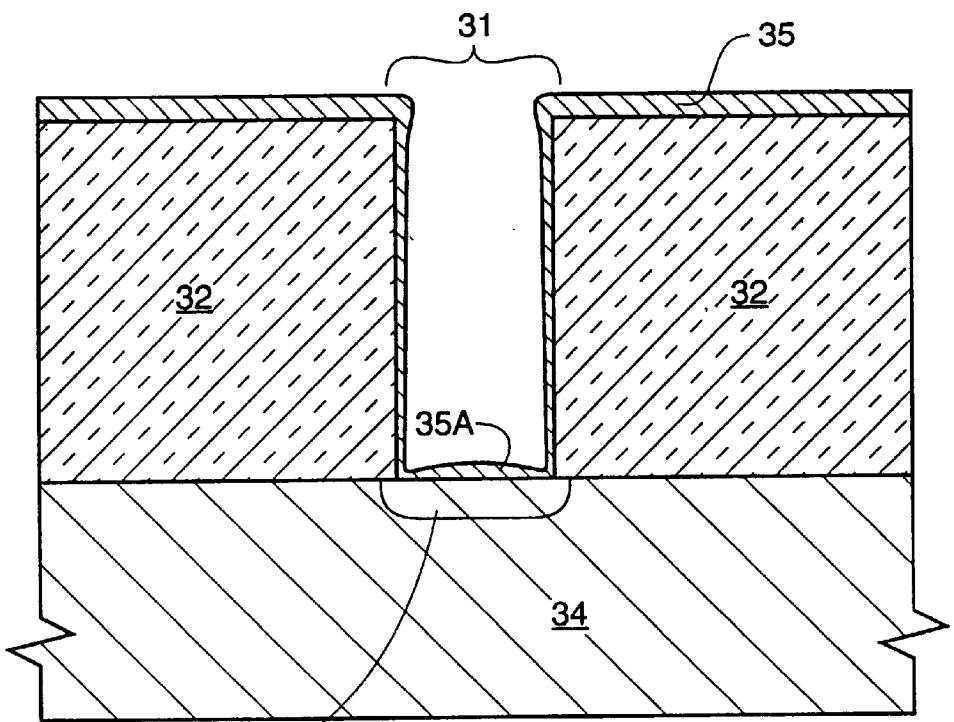
FIG. 3 is a cross-sectional view of a contact opening having a narrow aspect ratio that has been etched through an insulative layer to an underlying silicon substrate, the insulative layer and the contact opening having been subjected to a blanket deposition of titanium metal.

Referring now to FIG. 3, which is but a tiny cross-sectional area of a silicon wafer undergoing an integrated circuit fabrication process, a contact opening 31 having a narrow aspect ratio has been etched through a BPSG layer 32 to a diffusion region 33 in an underlying silicon substrate 34. A titanium metal layer 35 is then deposited over the surface of the wafer. Because titanium metal is normally deposited by sputtering, it deposits primarily on horizontal surfaces. Thus, the portions of the titanium metal layer 35 on the walls and at the bottom of the contact opening 31 are much thinner than the portion that is outside of the opening on horizontal surfaces. The portion of titanium metal layer 35 that covers diffusion region 33 at the bottom of contact opening 31 will be denoted 35A. At least a portion of the titanium metal layer 35A will be converted to titanium silicide in order to provide a low-resistance interface at the surface of the diffusion region.

Figure 4:
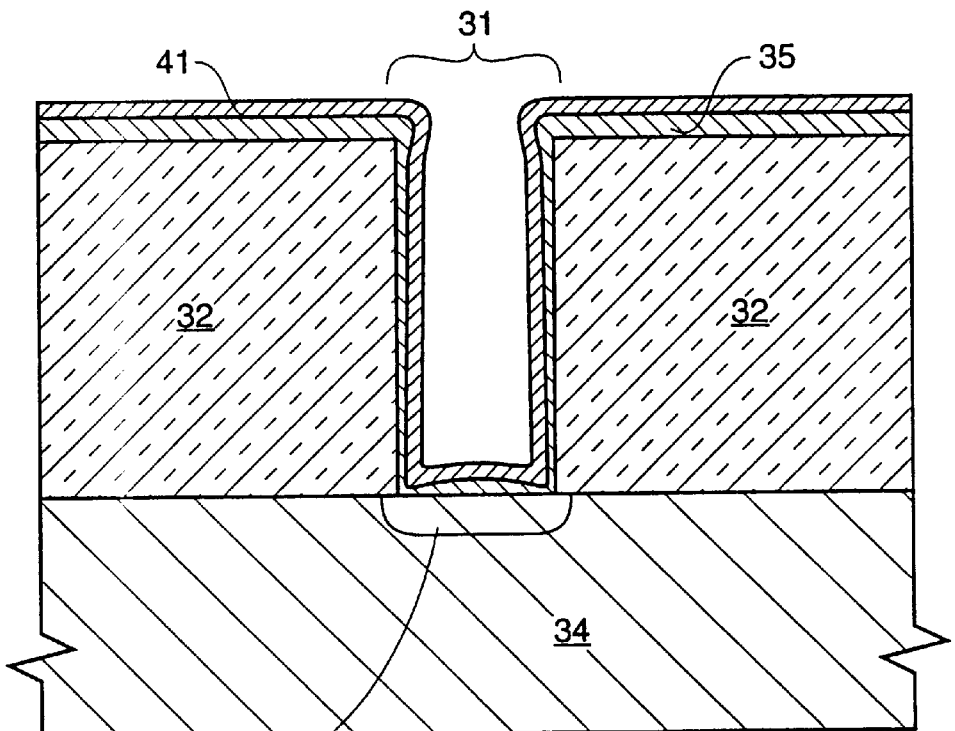
FIG. 4 is a cross-sectional view of the contact opening of FIG. 3 following the deposition of an amorphous titanium nitride film.

Referring now to FIG. 4, a titanium nitride barrier layer 41 is then deposited utilizing the LPCVD process, coating the walls and floor of the contact opening 31.

Figure 5:
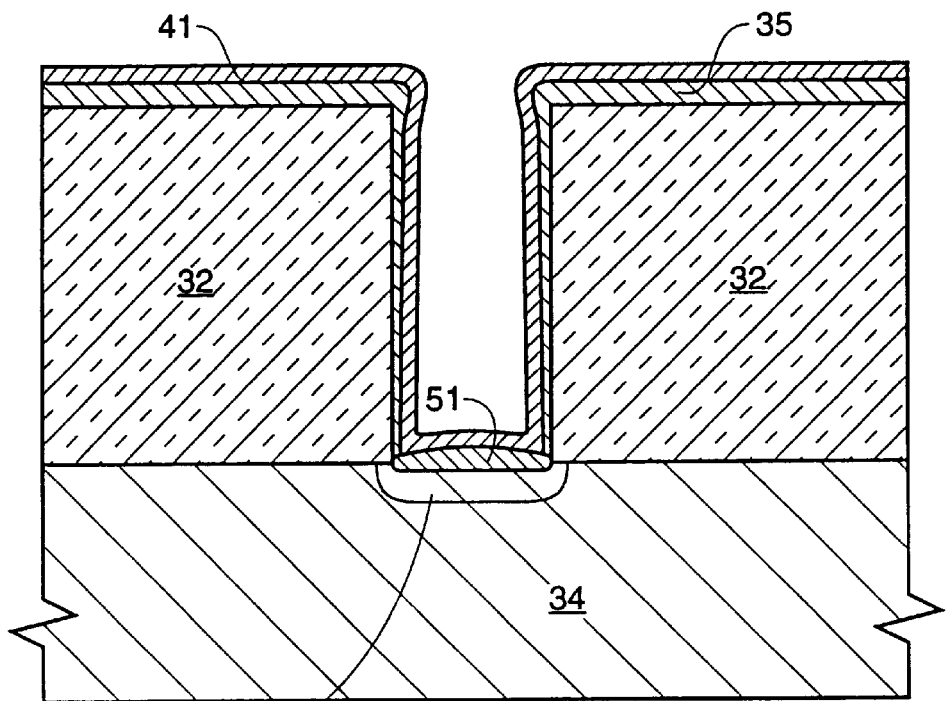
FIG. 5 is a cross-sectional view of the contact opening of FIG. 4 following an anneal step.

Referring now to FIG. 5, a high-temperature anneal step in an ambient gas such as nitrogen, argon, ammonia, or hydrogen is performed either after the deposition of the titanium metal layer 35 or after the deposition of the titanium nitride layer 41. Rapid thermal processing (RTP) and furnace annealing are two viable options for this step. During the anneal step, the titanium metal layer 35A at the bottom of contact opening 31 is either partially or completely consumed by reaction with a portion of the upper surface of the diffusion region 33 to form a titanium silicide layer 51. The titanium silicide layer 51, which forms at the interface between the diffusion region 33 and titanium metal layer 35A, greatly lowers contact resistance in the contact region.

Figure 6:
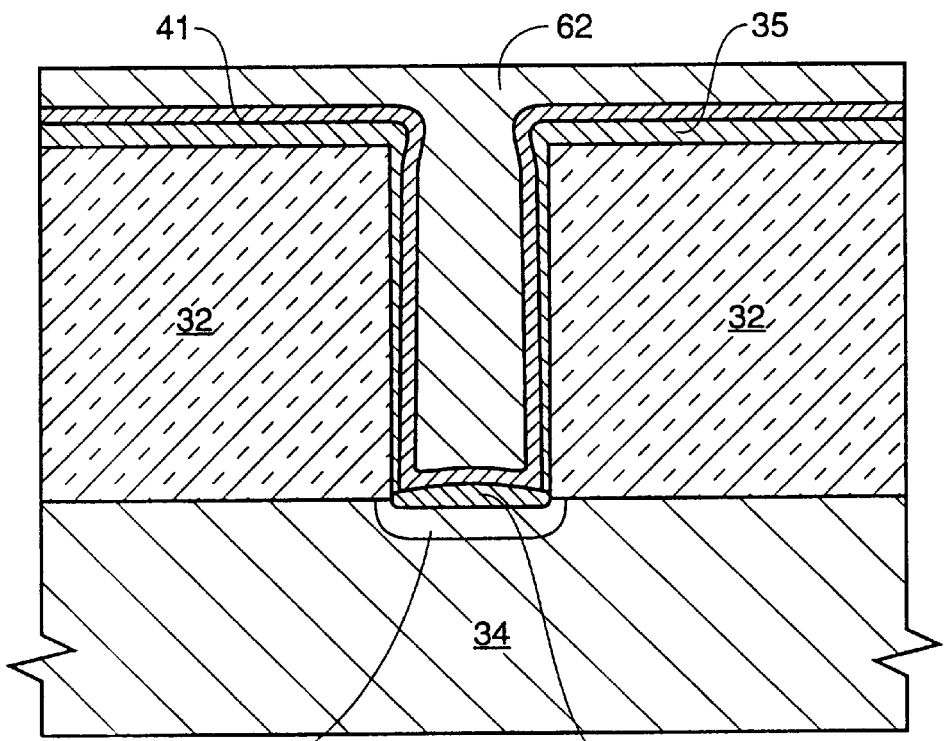
FIG. 6 is a cross-sectional view of the contact opening of FIG. 5 following the deposition of a conductive material layer.

Referring now to FIG. 6, a low-resistance conductive layer 62 of metal or heavily-doped polysilicon may be deposited on top of the titanium nitride barrier layer 41. Tungsten or aluminum metal is commonly used for such applications. Copper or nickel, though more difficult to etch than aluminum or tungsten, may also be used.

Although only several embodiments of the inventive process have been disclosed herein, it will be obvious to those having ordinary skill in the art that modifications and changes may be made thereto without affecting the scope and spirit of the invention as claimed.

What is claimed is:

1. A low-resistance contact structure in an integrated semiconductor comprising:

a semiconductor wafer having a silicon region on an exposed surface, said silicon region including a diffusion region;

a dielectric layer located on said silicon region, said dielectric layer having an upper surface;

a high aspect ratio contact opening defined by an opening having a first size in said dielectric layer, sidewalls having a second size extending through said dielectric layer to said diffusion region in said silicon region of said semiconductor wafer, and a bottom having a third size located on said diffusion region of said silicon region of said semiconductor wafer;

a layer of titanium metal deposited on the upper surface of said dielectric layer and deposited on the sidewalls and the bottom of the high aspect ratio contact opening extending through said dielectric layer, said layer of titanium metal having a first thickness on the sidewalls and the bottom of the high aspect ratio contact opening reducing the second size of the sidewalls of the high aspect ratio contact opening and reducing the third size of the bottom of the high aspect ratio contact opening, and having a second thickness on the upper surface of said dielectric layer, the first thickness of said layer of titanium metal being thinner than the second thickness the second thickness of the layer of titanium metal reducing the first size of the opening of the high aspect ratio contact opening such that the first size of the high aspect ratio contact opening is smaller than the second size of the sidewalls of the high aspect ratio contact opening and smaller than the third size of the bottom of the high aspect ratio contact opening;

a titanium silicide layer within said high aspect ratio contact opening adjacent said diffusion region of said silicon region, said titanium silicide layer formed from the first thickness of said layer of titanium metal on the bottom of the high aspect ratio contact opening said titanium silicide layer contacting the first thickness of said layer of titanium metal on the sidewalls of the high aspect ratio contact opening;

an amorphous titanium nitride film containing carbon impurities therein substantially covering said titanium metal deposited on the high aspect ratio contact opening sidewalls, substantially covering said titanium metal on the upper surface of the dielectric layer, and substantially covering said titanium silicide layer, said titanium nitride film causing the first size of the opening of the high aspect ratio contact opening having a layer of titanium metal thereon to be smaller than the second size of the sidewalls of the high aspect ratio contact opening having a layer of titanium metal thereon, and smaller than the third size of the bottom of the high aspect ratio contact opening having titanium silicide thereon; and a conductive material filling said high aspect ratio contact opening and covering at least a portion of said amorphous titanium nitride film containing carbon impurities therein substantially covering said titanium metal on said upper surface of said dielectric layer, said conductive material having a smaller size at the first size of the opening of the high aspect ratio contact opening in said dielectric layer and having a larger size at the second size of the sidewalls of the high aspect ratio contact opening in said dielectric layer and the third size of the bottom of the high aspect ratio contact opening in said dielectric layer.

2. The low-resistance contact structure of claim 1, wherein said conductive material is selected from the group consisting of tungsten, aluminum, copper, and nickel.

3. The low-resistance contact structure of claim 1, wherein said conductive material is doped polycrystalline silicon.

* * * * *

UNITED STATES PATENT AND TRADEMARK OFFICE
CERTIFICATE OF CORRECTION

PATENT NO. : 6,081,034
DATED : June 27, 2000
INVENTOR(S) : Gurtej S. Sandhu, Trung T. Doan and Tyler A. Lowrey It is certified that error appears in the above-identified patent and that said Letters Patent is hereby corrected as shown below:

Title page,
Item [56], References Cited, Yamaguchi et al" reference, before "3/1991" insert -- * --
"Matsuda" reference, before "7/1992" insert -- * --
"Klersy et al." reference, before 7/1996" insert -- * --
"Sandhu et al." referece, before "4/`999" insert -- * --
After "5,893,785" reference, insert -- * cited by examiner --

Column 2,
Lines 11-12, change "low temperature" to -- low-temperature --

Column 4,
Line 21, change "lowpressure" to -- low-pressure --
Line 43, change "(dimethylamido" to -- dimethylamido --

Column 5,
Line 13, change "precursor material" to -- tetrakis-dialkylamido-titanium --

Column 6,
Line 60, change "to-such" to -- to such --

Column 8,
Line 8, insert a comma after "thickness"
Line 20, insert a comma after "opening"

Signed and Sealed this

Twenty-third Day of December, 2003

JAMES E. ROGAN
*Director of the United States Patent and Trademark Office*